(12) United States Patent
Hsu

(10) Patent No.: US 6,346,441 B1
(45) Date of Patent: Feb. 12, 2002

(54) METHOD OF FABRICATING FLASH MEMORY CELL USING TWO TILT IMPLANTATION STEPS

(75) Inventor: Chen-Chung Hsu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/273,477

(22) Filed: Mar. 19, 1999

(51) Int. Cl.$^7$ ............................................... H01L 21/336
(52) U.S. Cl. ...................... 438/257; 438/286; 438/302; 438/303
(58) Field of Search ................ 438/147, 217, 438/257, 286, 289, 301, 302, 303

(56) References Cited

U.S. PATENT DOCUMENTS

| | | | | | |
|---|---|---|---|---|---|
| 5,217,910 A | * | 6/1993 | Shimizu | ...................... | 437/35 |
| 5,218,221 A | * | 6/1993 | Okumura | ...................... | 257/336 |
| 5,286,665 A | * | 2/1994 | Muragishi | ...................... | 437/44 |
| 5,366,915 A | * | 11/1994 | Kodama | ...................... | 437/43 |
| 5,376,566 A | * | 12/1994 | Gonzalez | ...................... | 437/35 |
| 5,399,895 A | * | 3/1995 | Koga | ...................... | 257/372 |
| 5,413,946 A | * | 5/1995 | Hong | ...................... | 437/35 |
| 5,432,106 A | * | 7/1995 | Hong | ...................... | 437/35 |
| 5,491,099 A | * | 2/1996 | Hsu | ...................... | 437/35 |
| 5,496,747 A | * | 3/1996 | Hong | ...................... | 437/35 |
| 5,591,652 A | * | 1/1997 | Matsushita | ...................... | 437/35 |
| 5,783,457 A | * | 7/1998 | Hsu | ...................... | 437/35 |
| 5,891,774 A | * | 4/1999 | Ueda | ...................... | 438/264 |
| 6,008,080 A | * | 12/1999 | Chuang | ...................... | 438/200 |
| 6,087,227 A | * | 7/2000 | Hsu | ...................... | 438/275 |

* cited by examiner

Primary Examiner—Mary Wilczewski

(57) ABSTRACT

A method of fabricating a flash memory cell is described. The present invention forms the flash memory cell comprising an asymmetric source/drain region with tilt implantation. By the tilt implantation, a lightly doped region can be formed under a spacer before the formation of the spacer, or after the formation of the spacer. A photo-mask procedure thus does not need in the invention for forming the lightly doped source region. The fabrication process is simplified and the fabrication cost is also reduced.

16 Claims, 5 Drawing Sheets

METHOD OF FABRICATING FLASH MEMORY CELL USING TWO TILT IMPLANTATION STEPS

BACKGROUND OF THE INVENTION

1. Field of the Invention

The present invention relates to a semiconductor fabricating method. More particularly, the present invention relates to a method of fabricating a source-side-injection (SSI) programming flash memory cell.

2. Description of the Related Art

Nonvolatile memories are currently used in electronic devices to store structure data, program data and other data during repeated reading and writing operations. The field of the nonvolatile memories has recently focused on the electrically erasable programmable read only memory (EEPROM).

A conventional EEPROM comprises a stacked gate, which is used for storing charge, a floating gate and a controlling gate, which is used for controlling data storage. The floating gate is located between the controlling gate and the substrate without connecting any conductive line. The controlling gate connects to a word line. A source region and a drain region, which are on opposite sides of the stacked gate and in the substrate, connect to a bit line.

A flash memory is a type of EEPROM. Since the flash memory has a high programming speed, there is a great development potential of flash memory. During a reading, a writing, a programming, or a erasure operation of the conventional flash memory, electrons flow through a channel to the floating gate. However, a high voltage is required to drive the electrons flowing through the channel to the floating gate when performing the reading, the writing, the programming, or the erasure operation. Unfortunately, applying the high voltage easily leads to a punch-through problem. This, in turn, causes current to occur between a source region and a drain region. The occurrence of current between the source region and the drain region may further lead to power consumption.

The source-side-injection (SSI) programming flash memory cell is a type of flash memory cell. Because the SSI programming flash memory cell can be performed with a lowered drain voltage, the SSI programming flash memory cell effectively prevents the occurrence of the punch-through problem.

FIGS. 1A through 1C are schematic, cross-sectional views showing a conventional method of fabricating a SSI programming flash memory cell.

In FIG. 1A, a substrate 100 comprising a stacked gate 101 is provided. The stacked gate 101 comprises a tunneling oxide layer 102, a polysilicon floating gate 104, an oxide layer 106, and a polysilicon controlling gate 108. An ion implantation is performed. The substrate 100 is lightly doped with n-type ions (shown as $N^-$ in FIG. 1A). Lightly doped regions 112 and 114 are formed in the substrate 100 on opposite sides of the stacked gate 101.

In FIG. 1B, a mask layer 120 is formed on one side of the substrate 100 to cover the lightly doped region 114. An ion implantation step is performed. The substrate 100 exposed by the mask layer 120 is heavily doped with n-type ions (shown as $N^+$ in FIG. 1B). A drain region 116 is formed in the substrate 100 beside the stacked gate 101 and in the substrate 100.

In FIG. 1C, a spacer 110, such as a silicon oxide layer, is formed on a sidewall of the staked gate 101. An ion implantation step is performed with the spacer 110 and the stacked gate 101 serving as masks. The substrate 100 is heavily doped with n-type ions (shown as $N^+$ in FIG. 1C). A source region 118, which is next to a lightly doped region 114a, is formed in the substrate 100.

In the conventional method of fabricating the SSI programming flash memory cell, the source region 118 and drain region 116 have to be formed separately. Therefore, it needs an additional photo-mask procedure, as described in FIG. 1B. The fabrication cost thus is increased.

SUMMARY OF THE INVENTION

The invention provides a method of fabricating a flash memory cell. A stacked gate is formed on a substrate. Lightly doped regions are formed in the substrate and on opposite sides of the stacked gate. A first spacer and a second spacer are formed on opposite sidewalls of the stacked gate. The first spacer and the second spacer cover a portion of the lightly doped regions. A drain region is formed in the substrate beside the first spacer. A source region is formed in the substrate in the substrate beside the second spacer. A tilt implantation step is performed to extend the drain region into a portion of the substrate under the spacer.

The invention provides a method of fabricating a flash memory cell. A stacked gate is formed on a substrate. A first spacer and a second spacer are formed on opposite sidewalls of the stacked gate. A drain region is formed in the substrate beside the first spacer. A source region is formed in the substrate beside the second spacer. A first tilt implantation is performed to extend the drain region into a portion of substrate under the first spacer. A second tilt implantation is formed to form a lightly doped region in the substrate under the second spacer.

The invention provides a method of fabricating a flash memory cell. A stacked gate is formed on a substrate. A first spacer and a second spacer are formed on opposite sidewalls of the stacked gate. A first tilt implantation is performed to form lightly doped regions in the substrate on opposite side of the stacked gate. Portions of the lightly doped regions are under the first spacer and the second spacer. A drain region is formed in the substrate beside the first spacer. A source region is formed in the substrate beside the second spacer. A second tilt implantation is performed to extend the drain region into a portion of substrate under the first spacer.

The present invention forms a SSI programming flash memory cell with a lightly doped source region. The lightly doped source region easily provides hot electrons. Thus, the amount of current is increased during the reading operation. Because the drain voltage is lowered in the present invention, the present invention prevents the occurrence of a punch-through problem. In comparison with the conventional method, which needs an additional photo-mask procedure, the invention forms an asymmetric source/drain region by tilt implantation. The fabrication process thus is simplified, and the fabrication cost can be further reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
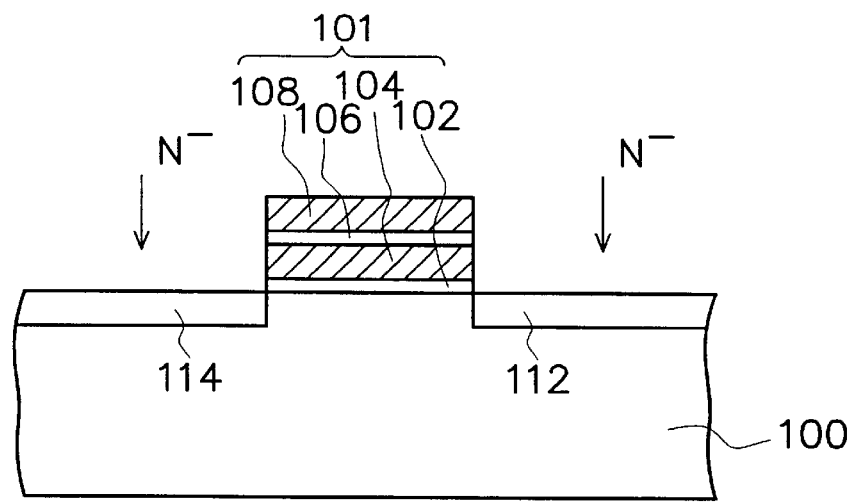
FIGS. 1A through 1C are schematic, cross-sectional views showing a conventional method of fabricating a SSI programming flash memory cell.
Figure 1B:
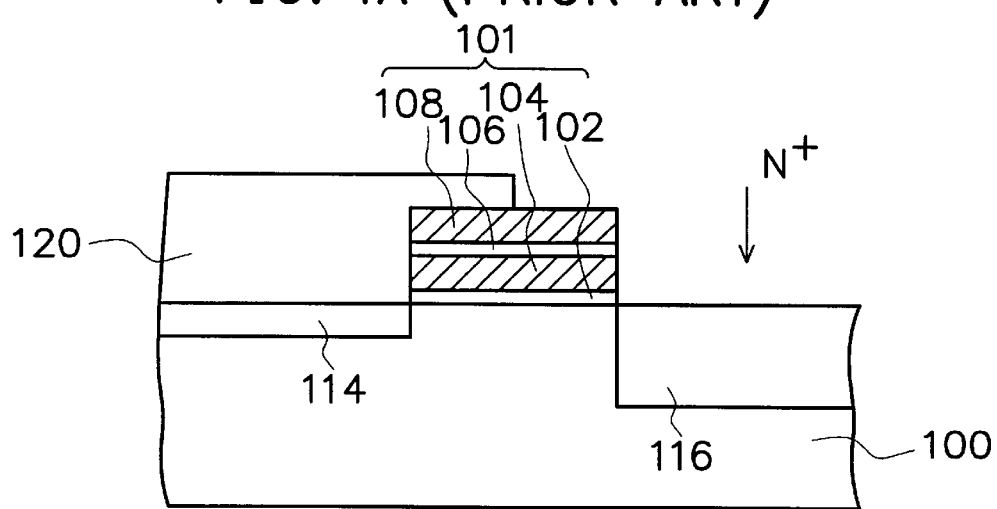
Figure 1C:
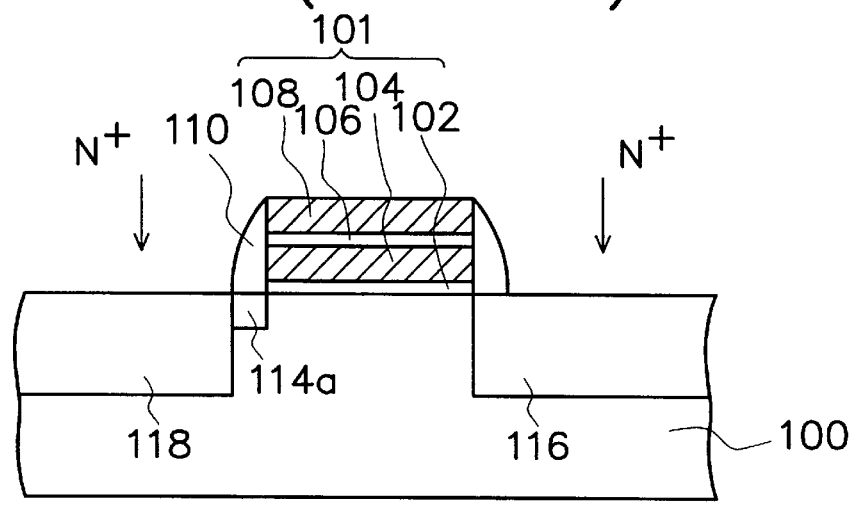

Reference will now be made in detail to the present preferred embodiments of the invention, examples of which are illustrated in the accompanying drawings. Wherever possible, the same reference numbers are used in the drawings and the description to refer to the same or like parts.

Figure 2A:
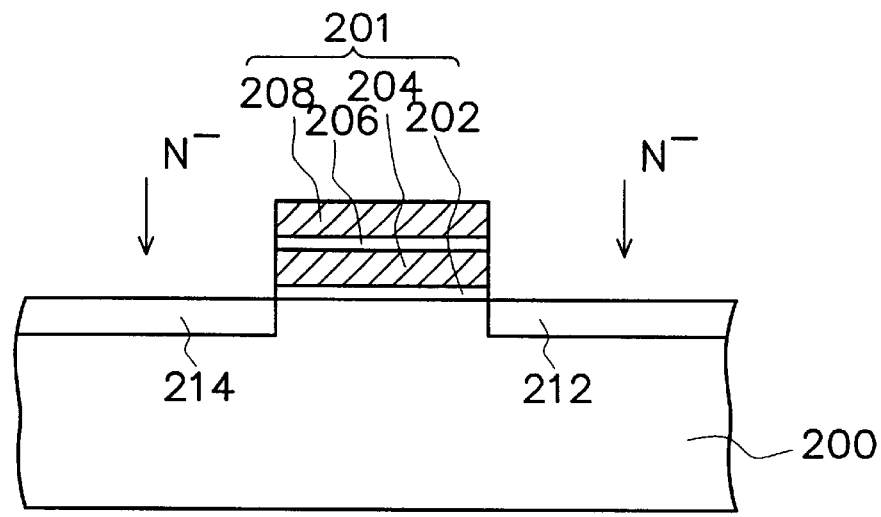
FIGS. 2A through 2C are schematic, cross-sectional views showing a method of fabricating a SSI programming flash memory cell according to a first preferred embodiment of the invention.
Figure 2B:
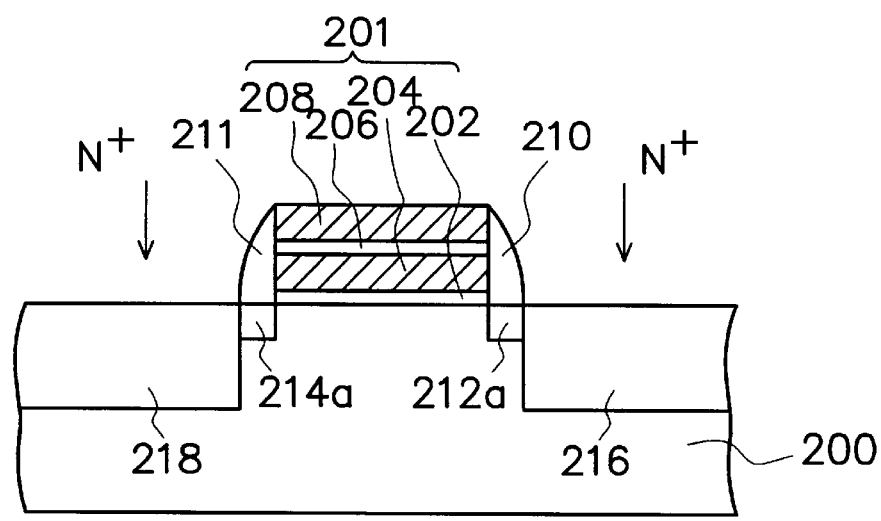
Figure 2C:
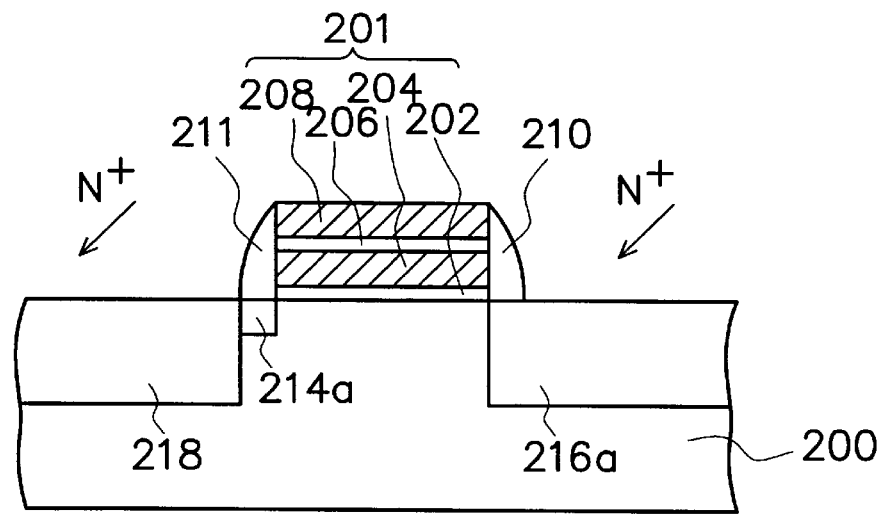

FIGS. 2A through 2C are schematic, cross-sectional views showing a method of fabricating a SSI programming flash memory cell according to a first preferred embodiment of the invention.

The following preferred embodiments take an n-type source region and an n-type drain region as examples. It is appreciated the technique disclosed in this invention may also be used to form a p-type source region and a p-type drain region by interchanging N to P and n-type ions to p-type ions.

In FIG. 2A, a substrate 200 comprising an isolation region (not shown), such as a shallow trench isolation (STI) structure, is provided. A stacked gate 201 is formed on the substrate 200. The stacked gate 201 can be formed by the following exemplary steps. An oxide layer (not shown) having a preferred thickness of about 70 angstroms to 200 angstroms is formed on the substrate 200 by thermal oxidation. An in-situ doped polysilicon layer (not shown) is formed on the oxide layer by chemical vapor deposition (CVD). A dielectric layer (not shown), such as a silicon nitride layer or a silicon oxide layer, is formed on the in-situ doped polysilicon layer by chemical vapor deposition. A doped polysilicon layer is formed on the dielectric layer by chemical vapor deposition. A photolithographic and etching process is performed to pattern the four above-described layers. The stacked gate 201, comprising a tunneling oxide layer 202, a floating gate conductive layer 204, a dielectric layer 206, and a controlling gate conductive layer 208 formed in sequence over the substrate 200, thus is formed. An ion implantation step is performed on the substrate 200. The substrate 200 is lightly doped with n-type ions, such as phosphorus (P) ions or arsenic (As) ions (shown as N⁻ in FIG. 2A). Lightly doped regions 212 and 214 are formed in the substrate 200 on opposite sides of the stacked gate 201. In the ion implantation step, n-type ions preferably are implanted with a preferred doping concentration of about $1 \times 10^{13}$ to $1 \times 10^{14}$ ions/cm².

In FIG. 2B, a first spacer 210 and a second spacer 211 are formed on opposite sidewalls of the stacked gate 201. The first spacer 210 and the second spacer 211 can be formed by the following exemplary steps. A conformal isolation layer (not shown), such as a silicon nitride layer or a silicon oxide layer, is formed over the substrate 200 to cover the stacked gate 201. An anisotropic etching is performed to remove a portion of the isolation layer. The first spacer 210 and the second spacer 211 are formed on the opposite sidewalls of the stacked gate 201. The first spacer 210 covers a portion of the lightly doped region 212 (shown in FIG. 2A). The second spacer 211 covers a portion of the lightly doped region 214 (shown in FIG. 2A). An ion implantation step is performed with the first spacer 210 and the second spacer 211 serving as masks. A drain region 216 and a source region 218 are formed in the substrate 200 beside the first spacer 210 and the second spacer 211, respectively. Preferably, n-type ions, such as arsenic ions, are heavily implanted (shown as N⁺ in FIG. 2B) with a preferred doping concentration $1 \times 10^{15}$ to $1 \times 10^{16}$ ions/cm². A lightly doped region 212a remaining from the lightly doped region 212 (shown in FIG. 2A) is left under the first spacer 210 and next to the drain region 216. A lightly doped source region 214a remaining from the lightly doped region 214 (shown in FIG. 2A) is left under the second spacer and next to the source region 218.

In FIG. 2C, a single-direction tilt implantation step is performed to extend the drain region 216 (shown in FIG. 2B) into a portion of the substrate 200 under the first spacer 210. The single-direction tilt implantation preferably is performed with a preferred energy of about 30 KeV to 100 KeV and a preferred doping concentration of about $1 \times 10^{15}$ to $1 \times 10^{16}$ ions/cm². An angle between a doping direction of the single-direction tilt implantation and a source-to-drain direction preferably is about 15 degrees to 30 degrees. For example, arsenic ions are heavily implanted during the single-direction tilt implantation. The drain region 216a is formed in the substrate 200 and extends to a portion of the substrate 200 under the first spacer 210. The SSI programming flash memory cell thus is formed with the lightly doped source region 214a.

FIGS. 3A through 3D are schematic, cross-sectional views showing a method of fabricating a SSI programming flash memory cell according to a second preferred embodiment of the invention.

Figure 3A:
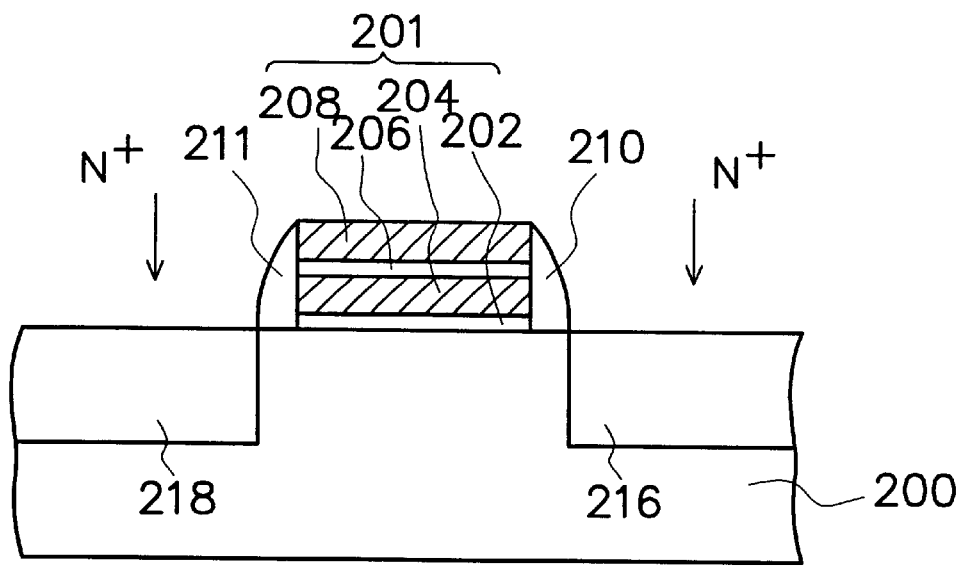
FIGS. 3A through 3D are schematic, cross-sectional views showing a method of fabricating a SSI programming flash memory cell according to a second preferred embodiment of the invention.

In FIG. 3A, a substrate 200 comprising an isolation region (not shown), such as a shallow trench isolation (STI) structure, is provided. A stacked gate 201 is formed on the substrate 200. A first spacer 210 and a second spacer 211 are formed on opposite sidewalls of the stacked gate 201. The steps of forming the stacked gate 201 and the first spacer 210 and the second spacer 211 are described in the first embodiment, so these steps are not here described repeatedly. A drain region 216 is formed in the substrate 200 beside the first spacer 210. A source region 218 is formed in the substrate 200 beside the second spacer 211. For example, arsenic ions are heavily implanted with a preferred doping concentration of about $1 \times 10^{15}$ to $1 \times 10^{16}$ ions/cm².

Figure 3B:
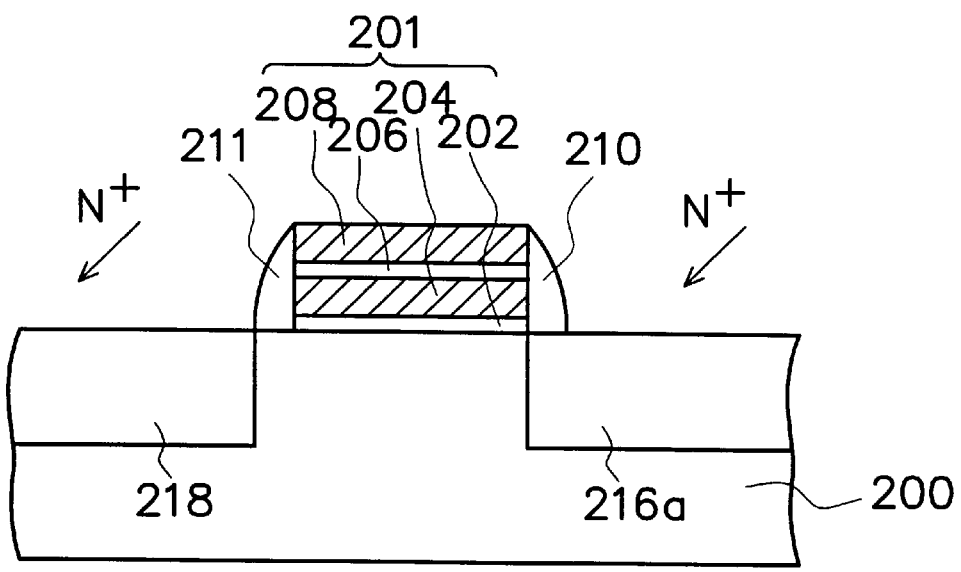

In FIG. 3B, a single-direction tilt implantation is performed in order to extend the drain region 216 (shown in FIG. 3A) into a portion of the substrate 200 under the first spacer 210. A drain region 216a is formed in the substrate 200 and extends to a portion of the substrate 200 under the first spacer 210. The single-direction tilt implantation is performed with a preferred energy of about 30 KeV and 100 KeV and a preferred doping concentration of about $1 \times 10^{15}$ to $1 \times 10^{16}$ ions/cm². An angle between a doping direction of the single-direction tilt implantation and a source-to-drain direction preferably is about 15 degrees to 60 degrees. For example, arsenic ions are heavily implanted, so as to form the drain region 216a in the substrate 200.

Figure 3C:
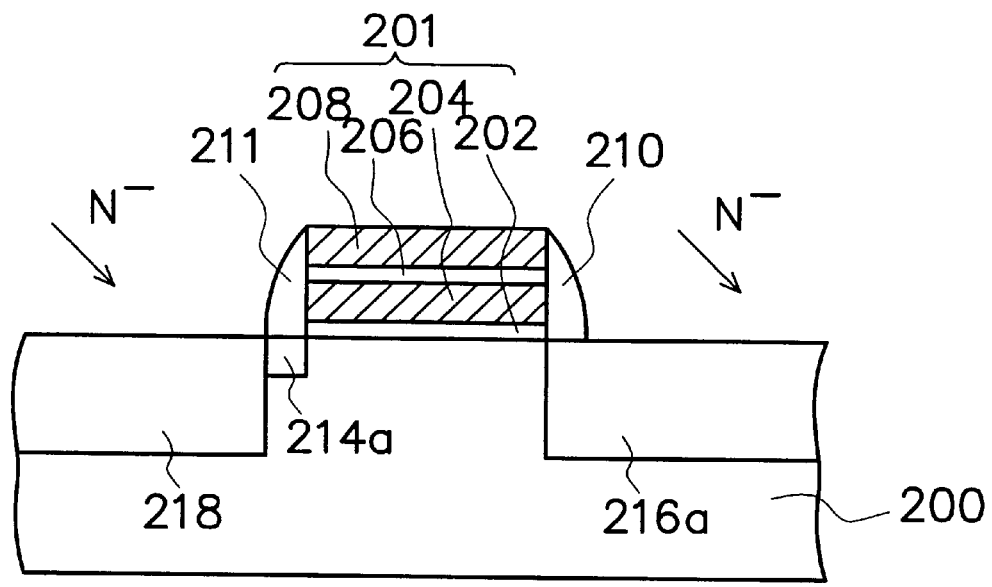

In FIG. 3C, the substrate 200 is doped to form a lightly doped source region 214a in a portion of the substrate 200 under the spacer cross-section 211 and next to the source region 218. The lightly doped source region 214a preferably is formed by single-direction tilt implantation with a preferred energy of about 10 KeV to 80 KeV and a preferred doping concentration of about $1\times10^{13}$ to $1\times10^{14}$ ions/cm$^2$. An angle between a doping direction of the single-direction tilt implantation and a source-to-drain direction preferably is about 15 degrees to 60 degrees. For example, arsenic ions are lightly implanted to form the lightly doped source region 214a in the substrate 200.

Figure 3D:
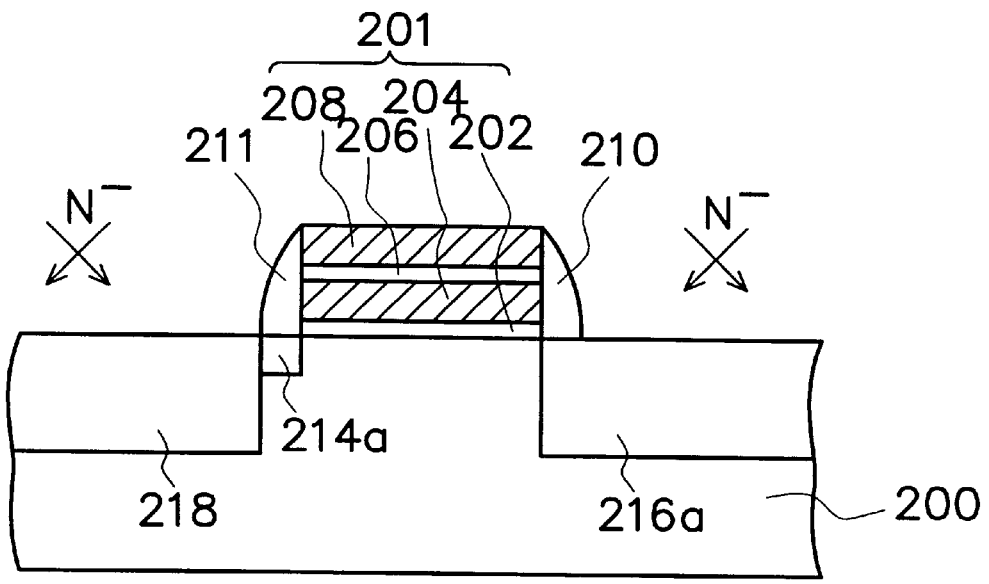

In FIG. 3D, besides the above-described step of the single-direction tilt implantation, the lightly doped source region 214a can also be formed by a rotational-direction tilt implantation. The rotational-direction tilt implantation is performed with a preferably energy of about 10 KeV to 80 KeV and a preferred doping concentration of about $1\times10^{13}$ to $1\times10^{14}$ ions/cm$^2$. A preferred tilt angle is about 15 degrees to 60 degrees. For example, arsenic ions are lightly implanted while the substrate 200 is rotated. The lightly doped source region 214a in a portion of the substrate 200 under the second spacer 211 and next to the source region 218 is formed in the substrate 200.

Figure 4A:
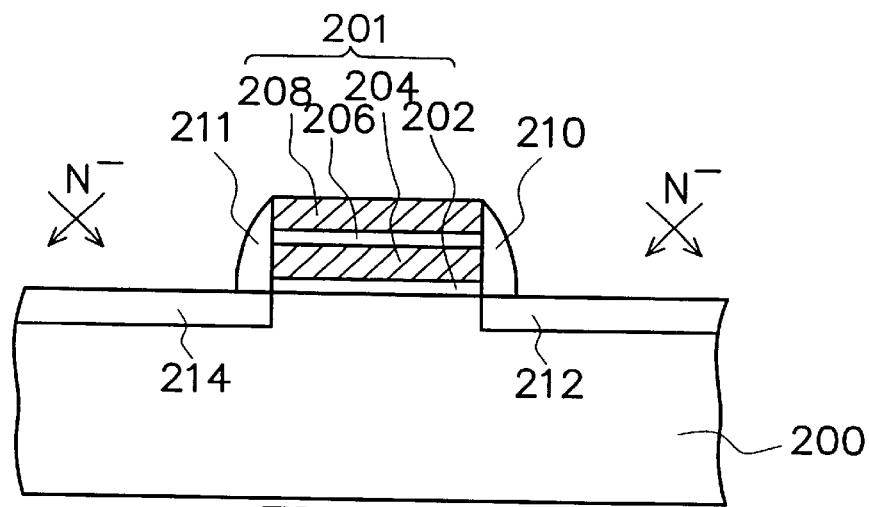
FIGS. 4A through 4C are schematic, cross-sectional views showing a method of fabricating a SSI programming flash memory cell according to a third preferred embodiment of the invention.
Figure 4B:
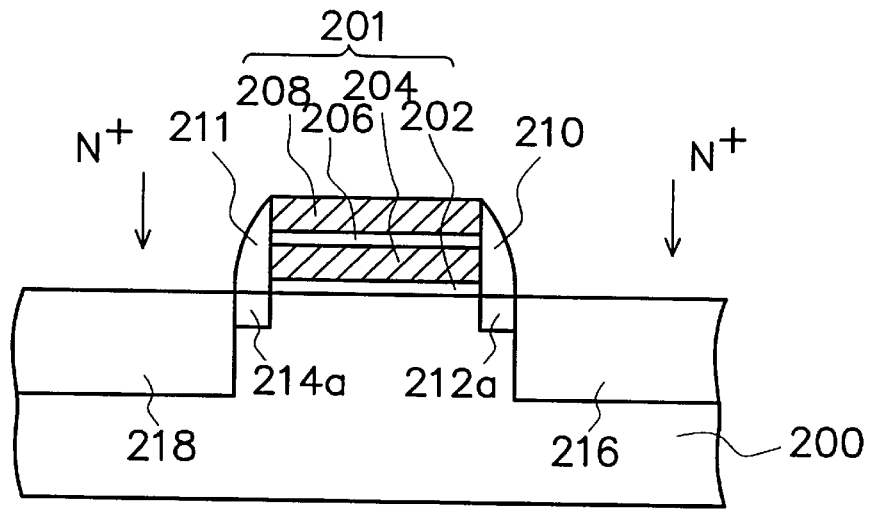
Figure 4C:
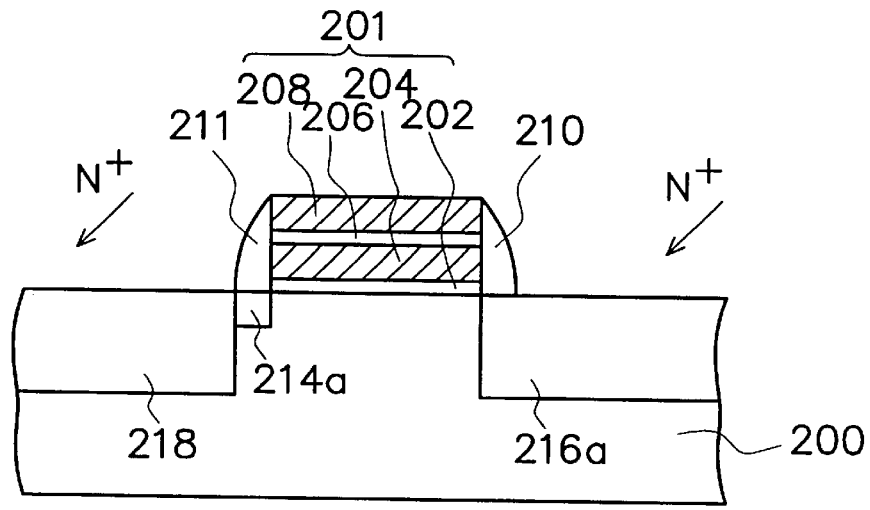

FIGS. 4A through 4C are schematic, cross-sectional views showing a method of fabricating a SSI programming flash memory cell according to a third preferred embodiment of the invention.

In FIG. 4A, a substrate 200 comprising an isolation region (not shown), such as a shallow trench isolation (STI) structure, is provided. A stacked gate 201 is formed on the substrate 200. A first spacer 210 and the second spacer 211 are formed on opposite sidewalls of the stacked gate 201. The steps of forming the stacked gate 201 and the spacer are described in the first embodiment, so these steps are not here described repeatedly. The substrate 200 is doped to form lightly doped regions 212 and 214 on opposite sides of the stacked gate 201 in the substrate 200. To the advantage of forming the lightly doped regions 212 and 214 in the substrate 200 under the first spacer 210 and the second spacer 212 respectively, a rotational-direction tilt implantation step is preferably performed. The rotational-direction tilt implantation step is performed with a preferred energy of about 10 KeV to 80 KeV and a preferred doping concentration of about $1\times10^{13}$ to $1\times10^{14}$ ions/cm$^2$. A preferred tilt angle is about 15 degrees to 60 degrees. For example, arsenic ions are lightly implanted while the substrate 200 is rotated. Thus, it is unnecessary to form the lightly doped regions 212 and 214 before the formation of the first spacer 210 and the second spacer 211.

In FIG. 4B, the substrate 200 is doped with the stacked gate 201, the first spacer 210, and the second spacer 211 serving as masks. A drain region 216 is formed in the substrate 200 adjacent to the stacked gate 201. A source region 218 is formed in the substrate 200 beside the stacked gate 201. The drain region 216 is next to a lightly doped region 212a, which remains from the lightly doped region 212. The drain region 218 is next to a lightly doped source region 214a, which remains from the lightly doped region 214. The source region 216 and the drain region 218 preferably are formed by, for example, ion implantation with n-type ions, such as arsenic ions. During the ion implantation, the substrate 200 is heavily doped with a preferred doping concentration of about $1\times10^{15}$ to $1\times10^{16}$ ions/cm$^2$ with the first spacer 210 and the second spacer 211 serving as masks. Because the first spacer 210 and the second spacer 211 serve as masks, the lightly doped source region 212a and the lightly doped drain region 214a are left under the first spacer 210 and the second spacer 211 and next to the drain region 216 and the source region 218.

In FIG. 4C, the substrate 200 is doped to make the drain region 216 (shown in FIG. 4B) extend to a portion of the substrate 200. A drain region 216a is formed in a portion of the substrate 200 under the first spacer 210. The substrate 200 preferably is doped by single-direction tilt implantation with a preferred energy of about 30 KeV to 100 KeV and a preferred doping concentration of about $1\times10^{15}$ to $1\times10^{16}$ ions/cm$^2$. A preferred tilt angle is about 15 degrees to 60 degrees. For example, arsenic ions are heavily implanted. The SSI programming flash memory cell thus is formed with the lightly doped source region 214a.

The invention forms a SSI programming flash memory cell, which is a type of a flash memory cell. The SSI programming flash memory cell is formed with a lightly doped source region. The lightly doped source region easily provides hot carriers. Thus, the amount of current is increased during the reading operation. Moreover, the drain voltage is lowered to 3.3V during programming operation. Thus, the present invention prevents the occurrence of a punch-through problem. Table 1 lists operation voltages of a programming operation, a erasure operation, and a reading operation.

TABLE 1

| Volt | Vgate | Vdrain | Vsource | Vsubstrate |
| --- | --- | --- | --- | --- |
| Programming Operation | 10~13 | 2.5~3.5 | 0 | 0 |
| Erasure Operation | −10 | 4 | 0 | 0 |
| Reading Operation | 5 | 0 | 1.5 | 0 |

As seen in the above-described preferred embodiments of the invention, hot electrons easily provided by the lightly doped source region. Thus, the amount of current is increased during the reading operation. Because the drain voltage is lowered, the present invention prevents the occurrence of the punch-through problem. In comparison with the conventional method, which needs an additional photo-mask procedure, the invention forms an asymmetric source/drain region by tilt implantation. The fabrication process thus is simplified, and the fabrication cost can be further reduced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory cell comprising:
   forming a stacked gate on a substrate, wherein a first spacer and a second spacer are formed on opposite sidewalls of the stacked gate;
   forming a drain region in the substrate beside the first spacer and a source region in the substrate beside the second spacer;
   performing a first single direction tilt implantation to extend the drain region into a drain region under a portion of substrate under the second spacer; and performing a second tilt implantation to form a lightly doped region in the substrate under the second spacer.

2. The method of claim 1, wherein the first tilt implantation step comprises a first single-direction tilt implantation.

3. The method of claim 2, wherein the first single-direction tilt implantation comprises doping arsenic ions.

4. The method of claim 2, wherein the first single-direction tilt implantation is performed with an energy of about 30 KeV to 100 KeV.

5. The method of claim 2, wherein an angle between a doping direction of the first single-direction tilt implantation and a source-to-drain direction is about 15 degrees to 60 degrees.

6. The method of claim 2, wherein the first single-direction tilt implantation is performed with a doping concentration of about $1\times10^{15}$ to $1\times10^{16}$ ions/cm$^2$.

7. A method of fabricating a flash memory cell comprising:

forming a stacked gate on a substrate, wherein a first spacer and a second spacer are formed on opposite sidewalls of the stacked gate;

forming a drain region in the substrate beside the first spacer and a source region in the substrate beside the second spacer;

performing a tilt implantation to extend the drain region into a portion of substrate under the first spacer;

performing a single-direction tilt implantation to form a lightly doped region in the substrate under the second spacer.

8. The method of claim 7, wherein the second single-direction tilt implantation comprises doping phosphorus ions.

9. The method of claim 7, wherein the second single-direction tilt implantation is performed with an energy of about 10 KeV to 80 KeV.

10. The method of claim 7, wherein an angle between a doping direction of the second single-direction tilt implantation and a source-to-drain direction is about 15 degrees to 60 degrees.

11. The method of claim 7, wherein the second single-direction tilt implantation is performed with a doping concentration of about $1\times10^{13}$ to $1\times10^{14}$ ions/cm$^2$.

12. A method of fabricating a flash memory cell comprising:

forming a stacked gate on a substrate, wherein a first spacer and a second spacer are formed on opposite sidewalls of the stacked gate;

performing a first tilt implantation to form lightly doped regions in the substrate on opposite side of the stacked gate, wherein portions of the lightly doped regions are under the first spacer and the second spacer;

forming a drain region in the substrate beside the first spacer and a source region in the substrate beside the second spacer; and performing a second single-direction tilt implantation to extend the drain region into a portion of the substrate under the first spacer.

13. The method of claim 12, wherein the single-direction tilt implantation comprises doping arsenic ions.

14. The method of claim 12, wherein the single-direction tilt implantation is performed with an energy of about 30 KeV to 100 KeV.

15. The method of claim 12, wherein an angle between a doping direction of the single-direction tilt implantation and a source-to-drain direction is about 15 degrees to 60 degrees.

16. The method of claim 12, the single-direction tilt implantation is performed with a doping concentration of about $1\times10^{15}$ to $1\times10^{16}$ ions/cm$^2$.

* * * * *